(12) United States Patent
Kazama et al.

(10) Patent No.: US 6,452,256 B1
(45) Date of Patent: Sep. 17, 2002

(54) SEMICONDUCTOR DEVICE

(75) Inventors: Atsushi Kazama, Chiyoda; Akihiro Yaguchi, Iwama; Hideo Miura, Koshigaya, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/648,454

(22) Filed: Aug. 28, 2000

(30) Foreign Application Priority Data

Jan. 28, 2000 (JP) ........................................ 2000-024691

(51) Int. Cl.[7] .............................................. H01L 23/495
(52) U.S. Cl. ........................ 257/668; 257/747; 257/748; 257/762; 257/778; 257/780
(58) Field of Search ................................. 257/668, 778, 257/738, 772, 777, 779, 780, 723, 730, 669, 737, 774, 747, 748, 758, 762

(56) References Cited

U.S. PATENT DOCUMENTS 5,280,850 A * 1/1994 Horiguchi et al. ........ 228/122.1
5,960,308 A * 9/1999 Akagawa et al. ............ 438/613

FOREIGN PATENT DOCUMENTS

JP    1154649      2/1999
JP    11204560     7/1999

OTHER PUBLICATIONS

"Method of Fabricating CSP, one of the prospective candidates for chip-size packaging at low cost is developed" (Nikkel Microdevice, Apr. 1998 Issue pp. 164–167).

* cited by examiner

*Primary Examiner*—David L. Talbott
*Assistant Examiner*—Luan Thai
(74) *Attorney, Agent, or Firm*—Antonelli, Terry, Stout & Kraus, LLP

(57) ABSTRACT

A small semiconductor device close in size to a semiconductor chip which prevents warping of semiconductor chips or wafer and delamination of an interface from an interlayer insulating film, both caused by thermal stresses of a rewiring layer. The use of a Cu composite alloy containing 80 vol. % or less of $Cu_2O$, which alloy has a smaller linear thermal expansion coefficient and a smaller elastic modulus than those of pure copper, as a main material of the rewiring layer can reduce the thermal stresses in the rewiring layer, realizing a semiconductor device in which warping of semiconductor chips or wafer and delamination of layers will not easily occur.

19 Claims, 5 Drawing Sheets

SEMICONDUCTOR DEVICE

BACKGROUND OF THE INVENTION

The present invention relates to a semiconductor device having external terminals on its semiconductor chip.

As equipment incorporating semiconductor devices are becoming smaller in size and weight as a result of widespread use of mobile communication terminals in recent years, there are growing demands for semiconductor devices that can cope with the trend for miniaturization.

Technologies are available that attempt to reduce the size of the semiconductor device as close to the chip size as possible. A package of such a semiconductor device is generally called a CSP (chip size package or chip scale package).

A conventional process of making CSPs involves slicing the wafer into individual chips and packaging each of these chips separately. A wafer-level CSP technology has been under development which forms a rewiring layer and external terminals on chips still in the form of a wafer and finally cutting the wafer into individual chips to reduce the packaging cost. An example of the wafer-level CSP technology has been proposed in an article in the Nikkei Microdevice, April 1998 issue (pages 164–167), "Method of fabricating CSP, one of the prospective candidates for chip-size packaging, at low cost is developed."

SUMMARY OF THE INVENTION

In the conventional technology described above, however, when a volume occupation factor of a rewiring layer in a projected plane of the semiconductor chip's principal surface is increased, it has been found that the semiconductor IC chips or wafer may warp and delamination may occur between layers.

The extensive examination into this problem by the inventor of this invention has provided the following findings. In the above CSP, the rewiring layer is arranged in the projection plane of the semiconductor chip's principal surface. The rewiring layer uses such metals as Cu. Because general metal materials including Cu have larger coefficients of linear expansion than that of the semiconductor chip, thermal load (temperature change) applied to the semiconductor device during manufacture or during the use of the product produces a difference in thermal deformation between the semiconductor chip and the rewiring layer, producing thermal stresses in the interior of the rewiring layer. When the rewiring layer has large thermal stresses, the semiconductor chip as a whole warps posing problems to such processes following the formation of the rewiring layer as the patterning of a protective film, the forming of external terminals, and the mounting the chip on a substrate. Further, a high stress that occurs in an interface between the rewiring layer and an interlayer insulation film or a protective film may result in delamination of these layers. These problems become conspicuous as the level of integration of the semiconductor device goes up and the volume occupation factor of the rewiring layer in the projected plane of the semiconductor chip becomes higher. In the semiconductor devices that make provisions for an increased speed, an area in the projected plane of the semiconductor chip's principal surface where there is no rewiring layer can be filled with power and ground wires to reduce electromagnetic noise. This, however, further increases the volume occupation factor.

In the wafer-level CSP described above, because the rewiring layer is formed while the chips are still in the form of a wafer, the wafer easily warps, making the problem more serious than when the packaging is done on single chips.

The object of this invention is to solve at least one of the above-described problems and provide a semiconductor device in which the semiconductor chips or wafer do not warp easily and delamination does not occur easily at an interface of an interlayer insulation film.

The semiconductor device to achieve the above objective comprises, for example: a semiconductor chip; electrode pads formed on the semiconductor chip; a first protective film covering an electrode pad forming surface of the semiconductor chip; an insulating film formed over the first protective film; lands formed over the insulating film and made mainly of a $Cu_2O$—Cu composite alloy (with a largest $Cu_2O$ content); wiring line electrically connecting the electrode pads and the lands and made mainly of a $Cu_2O$—Cu composite alloy; a second protective film formed over the insulating film to expose at least a part of the surface of the lands; and external terminals joined to the lands.

With this arrangement, because the Cu—$Cu_2O$ composite alloy has a smaller linear thermal expansion coefficient and a smaller elastic modulus than those of pure copper, the difference in the linear thermal expansion coefficient between the silicon oxide layer mainly used as the insulating film in the semiconductor chip wiring structure and the rewiring layer becomes smaller, thus reducing thermal stresses in the rewiring layer. This in turn reduces the warping of the semiconductors chips or a wafer and prevents delamination between the rewiring layer and the interlayer insulating film or protective film.

DESCRIPTION OF PREFERRED EMBODIMENTS

Embodiments of the present invention will be described by referring to the accompanying drawings.

Figure 1:
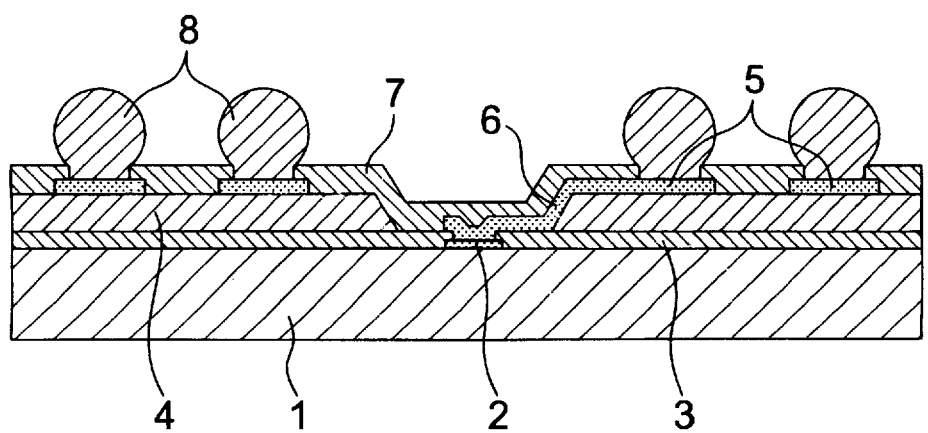
FIG. 1 is a schematic cross section of a semiconductor device according to a first embodiment of the present invention.
Figure 2:
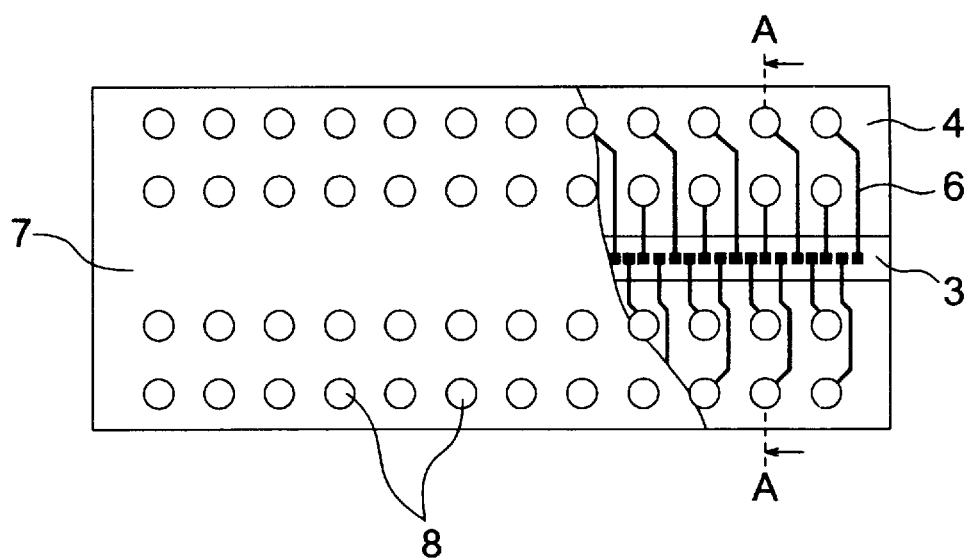
FIG. 2 is a schematic plan view of the semiconductor device according to the first embodiment of the invention.

FIG. 1 is a cross section of a semiconductor device according to the first embodiment of the present invention. FIG. 2 is a plan view of the first embodiment with a part of protective film removed. Here we explain about an example case in which electrode pads of a semiconductor chip are arranged in a line at the center. The electrode pads may be arranged in a plurality of rows or at the periphery of the chip. FIG. 1 represents a cross section taken along the line A—A of the plan view of FIG. 2.

As shown in FIGS. 1 and 2, the semiconductor device as the first embodiment of the invention has a semiconductor chip 1, electrode pads 2 of the chip, a first protective film 3 formed to expose at least a part of the surface of the electrode pads 2, an insulating layer 4 formed over the first protective film 3, conductive lands 5 formed over the insulating film 4, wiring lines 6 for electrically connecting the electrode pads 2 a nd the conductive lands 5, a second protective film 7 formed over the insulating film 4 to expose at least a part of the lands 5, and external terminals 8 connected to the lands 5.

This embodiment has a structure in which, as shown in FIG. 1, the conductive lands 5 and the wiring lines 6 are arranged in a projected plane of the principal surface of the semiconductor chip 1 and which can therefore realize a CSP close in size to the semiconductor chip. The CSP is a package structure that is expected to realize a high density integration and a high speed of the semiconductor device. It should be noted, however, that the higher the level of integration, the higher the volume occupation factor of the rewiring layer in the projected plane of the chip will be. There are cases where, to realize higher speeds, the power and ground wires of the rewiring layer are formed wide or in a state close to a solid layer. In such cases, the volume occupation factor of the rewiring layer becomes larger. The metal used in the rewiring layer has a larger linear thermal expansion coefficient than that of the semiconductor chip, so that thermal changes applied to the chip during manufacture or during the use of a product result in a difference in thermal deformation between the chip and the rewiring layer, causing thermal stresses in the rewiring layer. As the volume occupation factor of the rewiring layer increases, the thermal stresses in the rewiring layer also increase, leading to warping of the semiconductor chip and to delamination at an interface from an interlayer insulating film or protective film.

To reduce thermal stresses in the rewiring layer, the semiconductor device of this invention uses a composite alloy of Cu and $Cu_2O$ as a main material for the lands 5 and the lines 6.

Figure 3:
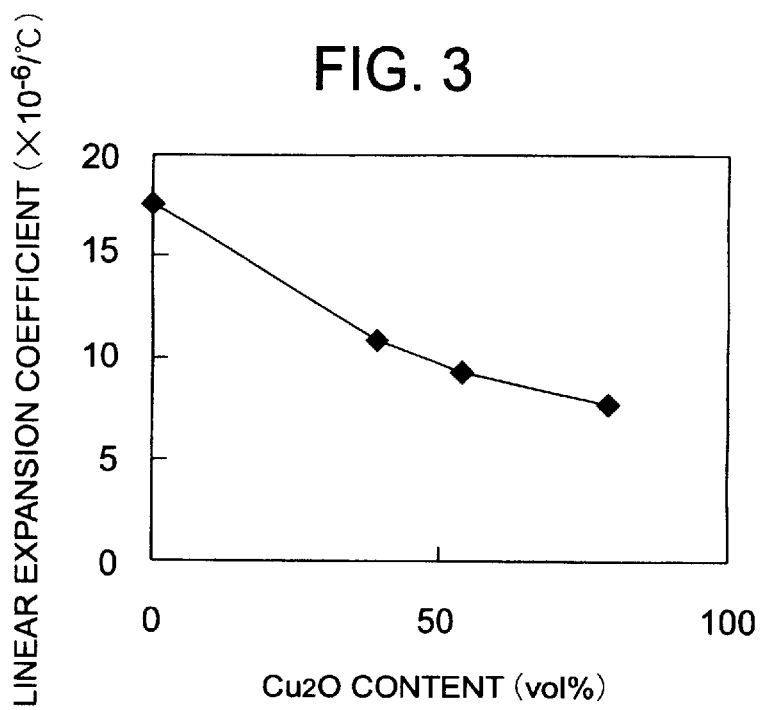
FIG. 3 is a graph showing a relation between a content of a $Cu_2O$ in a $Cu/Cu_2O$ composite alloy and a linear thermal expansion coefficient of the alloy.
Figure 4:
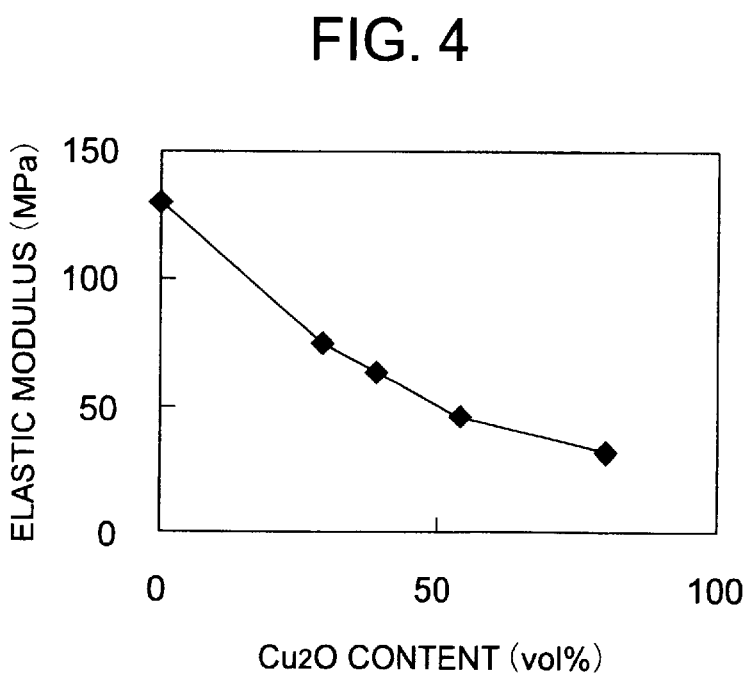
FIG. 4 is a graph showing a relation between a content of a $Cu_2O$ in a $Cu/Cu_2O$ composite alloy and an elastic modulus of the alloy.

A change in the linear thermal expansion coefficient of a $Cu/Cu_2O$ composite alloy used in the semiconductor device of this invention with respect to the content of $Cu_2O$ is shown in FIG. 3 and a change in the elastic modulus of the alloy is shown in FIG. 4. As shown in FIGS. 3 and 4, the linear thermal expansion coefficient and the elastic modulus of the alloy can progressively be reduced by increasing the content of $Cu_2O$. In more concrete terms, a Cu composite alloy containing 10 vol. % of $Cu_2O$ has a linear thermal expansion coefficient of approximately $15 \times 10^{-6}/°C$. and an elastic modulus of about 100 GPa. Here, a product of the elastic modulus and the linear thermal expansion coefficient is used as a measure of thermal stress. Compared with aluminum, another well known wiring material, pure copper with no other element mixed produces a large value of the product. But adding 10 vol. % of $Cu_2O$ to pure copper can reduce the value of the product down to almost the same level as aluminum. When the content of $Cu_2O$ is increased to 50 vol. %, the linear thermal expansion coefficient is reduced to about $10 \times 10^{-6}/°C$. and the elastic modulus to about 50 GPa. Increasing the $Cu_2O$ content further results in further reductions in both of these values, but the reduction in the linear thermal expansion coefficient in particular becomes insignificant. Considering the fact that a high content of $Cu_2O$ makes the material brittle, the practical upper limit of the $Cu_2O$ content is about 80%.

Figure 5:
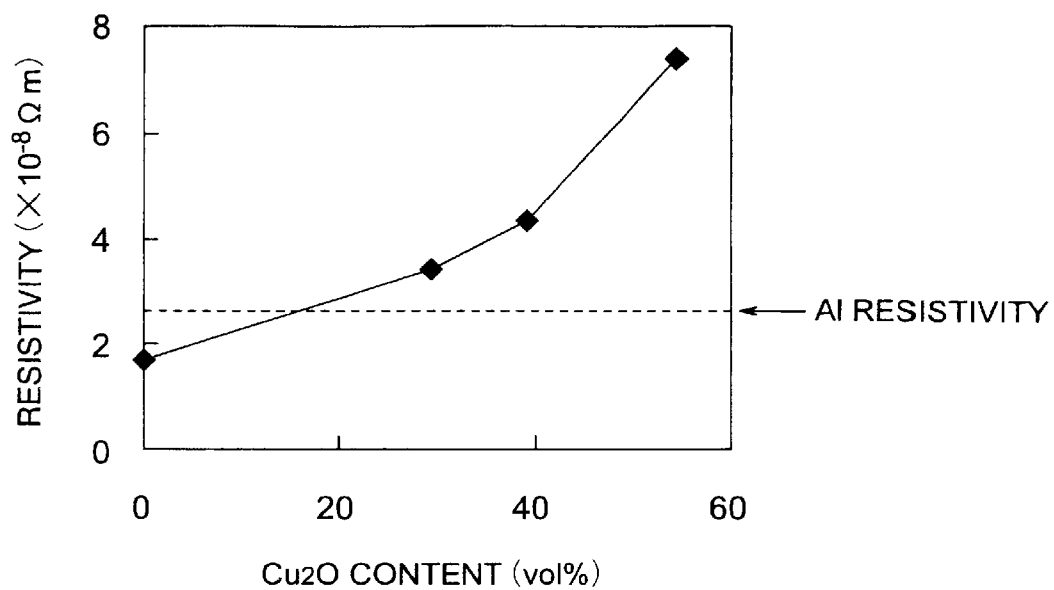
FIG. 5 is a graph showing a relation between a content of a $Cu_2O$ in a $Cu/Cu_2O$ composite alloy and a resistivity of the alloy.

FIG. 5 shows a change in resistivity as it relates to the content of $Cu_2O$. Increasing the $Cu_2O$ content results in an increased resistivity, raising a concern of increased wire resistance. Hence, the $Cu_2O$ content should preferably be determined by considering the upper limit of the wire resistance required of each product. To describe in more detail, about 20% content of $Cu_2O$ results in a resistivity almost equal to that of pure aluminum. If a higher conductivity than that of Al is desired, the $Cu_2O$ content should preferably be set equal to or less than 20%. Even when the content is 20% or more, however, a greater width of the wire enabled by the use of this alloy can reduce the wire resistance and thereby compensate for an increase in the resistivity.

In either case, increasing the $Cu_2O$ content of the $Cu/Cu_2O$ composite alloy can reduce thermal stresses produced in the lands 5 and the lines 6, compared with those when pure copper is used. This can reduce warping of the semiconductor chip and prevent delamination of the lands and wires 6 from the first protective film 3, the insulating film 4 and the second protective film 7.

In the semiconductor device of the first embodiment of the invention shown in FIG. 1, the first protective film 3 is a thin protective film formed to protect the surface of the semiconductor chip 1. The insulating film 4 is formed to expose the surface of the electrode pads 2, and the lines 6 and the lands 5 formed integral with the interconnects are formed over the insulating film 4 so that they are connected to the electrode pads 2. The lands 5 and the lines 6 are made mainly of a Cu alloy containing 80 vol. % or less of $Cu_2O$, and may be laminated with other metal layers such as Ni, Au and Cr. The second protective film 7 is formed over the insulating film 4 to protect the surfaces of the lands 5 and the lines 6. The external terminals 8 are made of a solder material (e.g., Pb—Sn eutectic solder and Sn—Ag—Cu solder) and joined to those portions of the lands 5 that are exposed from the second protective film 7.

As the operation speed of the semiconductor device increases, noise due to crosstalk between the lands 5 and lines 6 and the internal wires of the semiconductor chip 1 becomes more critical. The noise can be alleviated by increasing the thickness of the insulating film 4 to minimize capacitance between wires. When the CSP type semiconductor device mounted on a printed circuit board is subjected to temperature variations, the linear thermal expansion coefficient difference between the semiconductor chip and the printed circuit board causes thermal strains, giving rise to a problem of fatigue failure near the land connecting portions of the external terminals. The semiconductor device of this invention uses a material with low elasticity for the insulating film 4 and increases the width of the insulating film 4 to enable the insulating film 4 to absorb the thermal strain and thereby reduce the strain shared by the external terminals 8, thus assuring the reliability of the external terminals 8. The possible materials for the insulating film 4 include polyimide resin, polyetherimide resin, polyimide-amide resin, acrylic modified epoxy resin, epoxy resin compounded with rubber and silicone resin.

The semiconductor device of this invention has an insulating film, a protective film and a rewiring layer formed over the semiconductor chip. Because this structure facilitates the use of a method which forms these layers en masse over the entire wafer, the structure is suited for realizing the wafer-level CSP. When manufacturing semiconductor devices during the wafer process, if the rewiring layer has a large thermal stress, the wafer may warp after the rewiring layer is formed, causing trouble to the subsequent processes. With the semiconductor device of this invention, however, the use of a $Cu/Cu_2O$ composite alloy with a low thermal stress can minimize the warping of the wafer.

Figure 6:
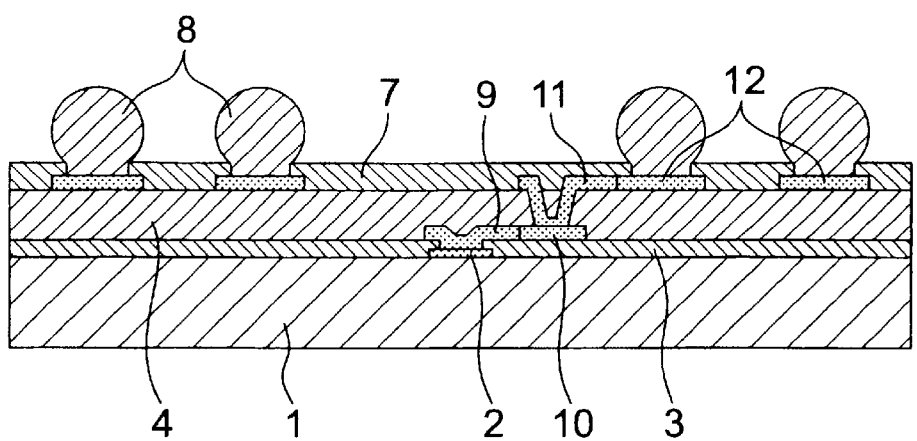
FIG. 6 is a schematic cross section of a semiconductor device according to a second embodiment of the present invention.

FIG. 6 is a cross section of the second embodiment of the invention. Over the first protective film 3 are formed first wiring lines 9 electrically connecting to the electrode pads 2 and also first lands 10 formed integral with the first conductive interconnects 9. An insulating film 4 is formed to expose at least a part of the surface of the first lands 10, and second wiring lines 11 and second lands 12 formed integral with the second wiring lines 11 are formed over the insulating film 4 so that they are connected to the exposed first lands 10. Then, external terminals 8 are joined to the second lands 12 exposed from a second protective film 7.

In the first embodiment of the invention, removing the insulating film 4 from above the electrode pads 2 to expose the electrode pads 2 from the insulating film 4 as by using a high power laser causes a damage to the interior of the semiconductor chip. Because of such manufacturing process problems, it may be difficult to abut a wiring structure directly connecting the electrode pads 2 to the lands 5. In such a case, the second embodiment is advantageous which forms the first lands 10 over the first protective film 3 and then forms necessary layers over the first lands 10. This embodiment also produces the similar effect to that of the first embodiment.

Figure 7:
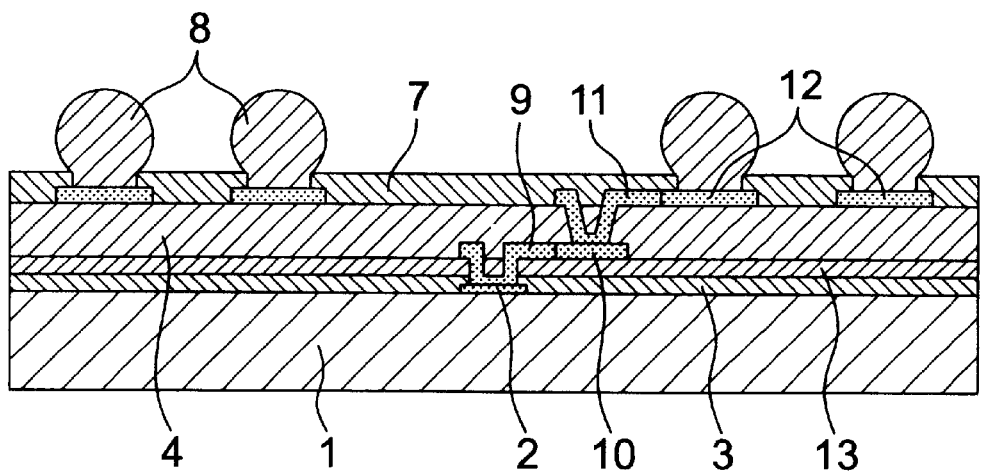
FIG. 7 is a schematic cross section of a semiconductor device according to a third embodiment of the present invention.

FIG. 7 is a cross section of the third embodiment of the invention. In the second embodiment, the first wiring lines 9 and the first lands 10 are located close to the internal wiring of the semiconductor chip 1, so that the capacitances between them may cause erroneous operations in high-speed devices. In that case, forming a second insulating film 13 between the first protective film 3 and the insulating film 4 and forming the first lines 9 and the first lands 10 over the second insulating film 13, as in the third embodiment, can reduce the capacitance. This embodiment can also produce an effect similar to that of the first embodiment.

Figure 8:
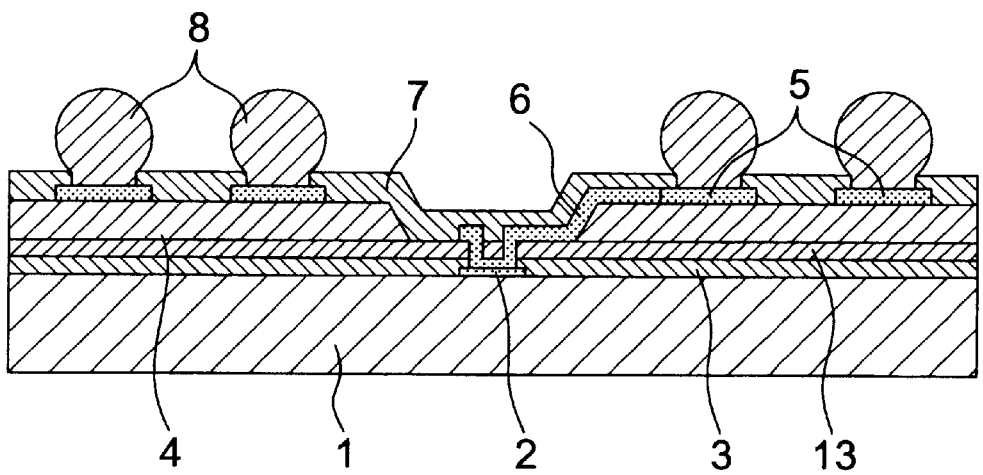
FIG. 8 is a schematic cross section of a semiconductor device according to a fourth embodiment of the present invention.

FIG. 8 is a cross section of the fourth embodiment of the invention. If in the first embodiment one wishes to reduce the capacitance between those portions of the lines 6 that are formed over the first protective film 3 and the internal wiring of the semiconductor chip 1, this can be achieved by forming a second insulating film 13 between the first protective film 3 and the insulating film 4 and then forming the lines 6 over the second insulating film 13 and the insulating film 4, as in the fourth embodiment. This embodiment can also produce the similar effect to that of the first embodiment.

Figure 9:
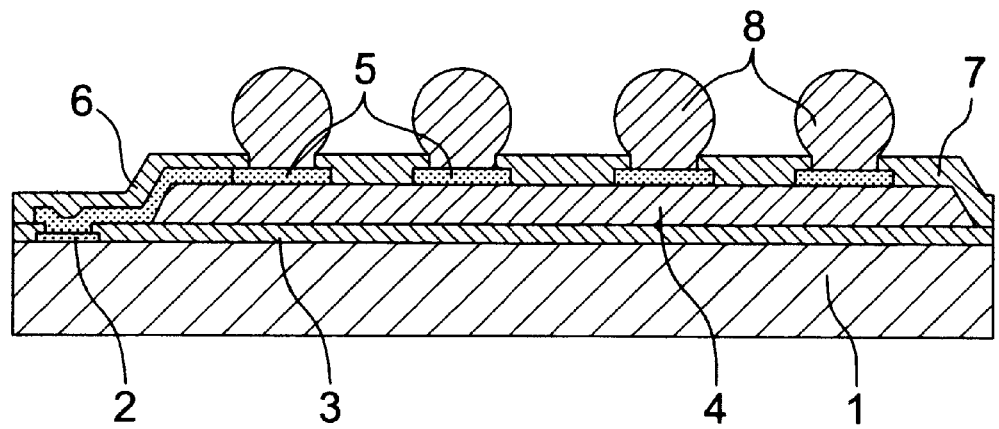
FIG. 9 is a schematic cross section of a semiconductor device according to a fifth embodiment of the present invention.

FIG. 9 is a cross section of the fifth embodiment of the invention.

The fundamental structure and materials are identical with those of the first embodiment. What differs from the first embodiment is that while the first embodiment has external terminals at the periphery of the chip and the rewiring layer is drawn out from the central part of the chip, this fifth embodiment has external terminals located at the central part of the chip with the interconnects drawn out from the periphery of the chip. The former structure is suited for memory products with a relatively small number—e.g., a few tens—of external terminals while the structure of this embodiment is suited for microcomputers and logic LSIs having as many as several hundred external terminals or more. This embodiment can also produce the similar effect to that of the first embodiment.

Figure 10:
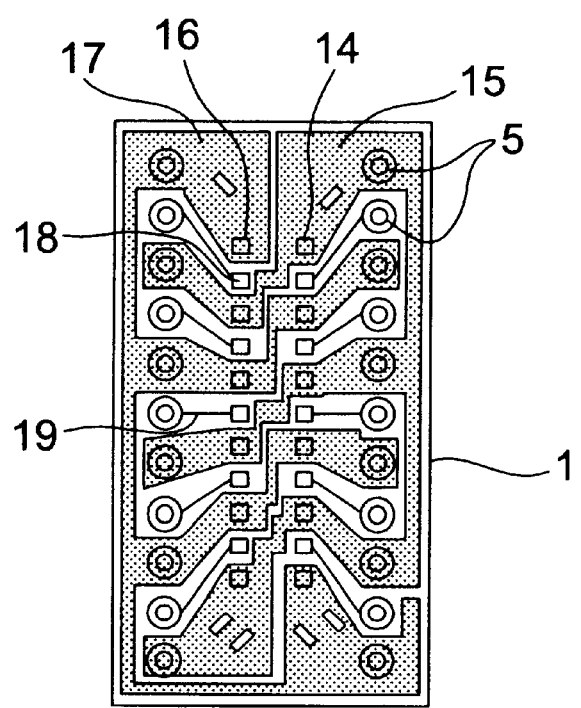
FIG. 10 is a schematic plan view of a semiconductor device according to a sixth embodiment of the present invention.

FIG. 10 is a plan view of the sixth embodiment of the invention.

This embodiment is similar in basic structure and material to the first embodiment, except for the plan view structure of the interconnects shown in FIG. 2. In FIG. 10 the protective film on the outermost surface and the external terminals shown in FIG. 2 are omitted to clarify the difference. The feature of this embodiment is that the power interconnects 17 and the ground interconnects 15 drawn out from the power pads 16 and the ground pads 14, respectively, both provided on the semiconductor chip, are significantly wider than the signal interconnects 19 drawn out from the signal pads 18 and that the areas occupied by both of the power and ground interconnects are significantly larger than those of FIG. 2. The main object of increasing the width of the interconnects is not only to reduce the resistances of the power interconnects and ground interconnects but to bring at least one of these interconnects close to the signal interconnects 19. This arrangement provides an effect of reducing various electromagnetic noise, such as simultaneous switching noise, that occurs when high frequency signals of several hundred MHz or more flow through the signal lines. In the conventional devices, Cu is used for interconnects and therefore increasing the area occupied by the interconnects poses various problems, such as large warping of the semiconductor chip, connection failure during solder-mounting, cracking of the insulating film, and delamination of the interface from the insulating film, which combine to make the electromagnetic noise difficult to eliminate. Forming the interconnects from a Cu composite alloy containing 80 vol. % or less of $Cu_2O$ as in this embodiment, however, can reduce thermal stresses, which in turn makes it possible to realize a semiconductor device in which the warping of the semiconductor chip or wafer or the delamination of the interface from the interlayer insulating film will not occur easily. In addition, reliability against electromagnetic noise can be enhanced.

With this invention, a semiconductor device can be realized in which neither the warping of the semiconductor chips or wafer nor the delamination of an interface from the interlayer insulating film will occur easily.

What is claimed is:

1. A semiconductor device comprising:

a semiconductor chip;

electrode pads formed on the semiconductor chip;

a first protective film covering an electrode pad forming surface of the semiconductor chip;

an insulating film formed over the first protective film;

lands formed over the insulating film and made mainly of a $Cu_2O$—Cu composite alloy;

wiring lines connecting the electrode pads and the lands and made mainly of a $Cu_2O$—Cu alloy;

a second protective film formed over the insulating film to expose at least a part of the surface of the lands; and external terminals joined to the lands.

2. A semiconductor device according to claim 1, wherein a content of the $Cu_2O$ in the $Cu_2O$—Cu composite alloy is 80 vol. % or less.

3. A semiconductor device according to claim 1, wherein a content of the $Cu_2O$ in the $Cu_2O$—Cu composite alloy is 10 vol. % or more.

4. A semiconductor device according to claim 1, wherein a second insulating film is interposed between the first protective film and the insulating film.

5. A semiconductor device according to claim 1, wherein the lines include signal wires, power wires and ground wires,
wherein the power wires and the ground wires are wider than the signal wires.

6. A semiconductor device according to claim 1, wherein the insulating film is made of silicon oxide.

7. A semiconductor device according to claim 6, wherein said $Cu_2O$—Cu composite alloy has a smaller linear thermal expansion coefficient than that of pure Cu.

8. A semiconductor device according to claim 7, wherein said $Cu_2O$—Cu composite alloy has a smaller elastic modulus than that of pure Cu.

9. A semiconductor device according to claim 6, wherein said $Cu_2O$—Cu composite alloy has a smaller elastic modulus than that of pure Cu.

10. A semiconductor device according to claim 1, wherein said $Cu_2O$—Cu composite alloy has a smaller linear thermal expansion coefficient than that of pure Cu.

11. A semiconductor device according to claim 10, wherein said $Cu_2O$—Cu composite alloy has a smaller elastic modulus than that of pure Cu.

12. A semiconductor device according to claim 1, wherein said $Cu_2O$—Cu composite alloy has a smaller elastic modulus than that of pure Cu.

13. A semiconductor device according to claim 1, wherein the content of the $Cu_2O$ in the $Cu_2O$—Cu composite alloy is 10–20 vol. %.

14. A semiconductor device according to claim 1, wherein at least one of said lands and said wiring lines is laminated with other metal layers selected from the group consisting of Ni, Au and Cr.

15. A semiconductor device according to claim 1, wherein said insulating film comprises a resin.

16. A semiconductor device according to claim 1, wherein said insulating film is made of a material selected from the group consisting of polyimide resin, polyetherimide resin, polyimideamine resin, acrylic modified epoxy resin, epoxy resin compounded with rubber, and silicone resin.

17. A semiconductor device according to claim 1, wherein the external terminals include a solder bump material.

18. A semiconductor device comprising:
a semiconductor chip;
electrode pads formed on the semiconductor chip;
a first protective film covering an electrode pad forming surface of the semiconductor chip;
first wiring lines and conductive first lands both formed over the first protective film and connected to each other;
an insulating film formed over the first protective film;
conductive second lands formed over the insulating film;
second wiring lines formed over the insulating film to connect the first lands and the second lands;
a second protective film formed over the insulating film to expose at least a part of the surface of the second lands; and
external terminals joined to the second lands;
wherein either the first lands and the first lines or the second lands and the second lines, or both, use as their main material a Cu composite alloy containing 80 vol. % or less of $Cu_2O$.

19. A semiconductor device comprising:
a semiconductor chip;
electrode pads formed on the semiconductor chip;
a first protective film covering an electrode pad forming surface of the semiconductor chip;
an insulating film formed over the first protective film;
lands formed over the insulating film;
wiring lines connecting the electrode pads and the lands and made mainly of a $Cu_2O$—Cu alloy;
a second protective film formed over the insulating film to expose at least a part of the surface of the lands; and
external terminals joined to the lands.

\* \* \* \* \*